United States Patent
Fields et al.

(10) Patent No.: US 12,288,685 B2
(45) Date of Patent: Apr. 29, 2025

(54) MODIFYING HYDROPHOBICITY OF A WAFER SURFACE USING AN ORGANOSILICON PRECURSOR

(71) Applicant: Lam Research Corporation, Fremont, CA (US)

(72) Inventors: Jeremy D. Fields, Portland, OR (US); Awnish Gupta, Hillsboro, OR (US); Douglas W. Agnew, North Miami, FL (US); Joseph R. Abel, West Linn, OR (US); Purushottam Kumar, Hillsboro, OR (US)

(73) Assignee: Lam Research Corporation, Fremont, CA (US)

( * ) Notice: Subject to any disclaimer, the term of this patent is extended or adjusted under 35 U.S.C. 154(b) by 876 days.

(21) Appl. No.: 17/045,629

(22) PCT Filed: Apr. 8, 2019

(86) PCT No.: PCT/US2019/026355
§ 371 (c)(1),
(2) Date: Oct. 6, 2020

(87) PCT Pub. No.: WO2019/199682
PCT Pub. Date: Oct. 17, 2019

(65) Prior Publication Data
US 2021/0384029 A1 Dec. 9, 2021

Related U.S. Application Data

(60) Provisional application No. 62/654,836, filed on Apr. 9, 2018.

(51) Int. Cl.
*H01L 21/02* (2006.01)
*C23C 16/455* (2006.01)
(Continued)

(52) U.S. Cl.
CPC .... *H01L 21/0234* (2013.01); *C23C 16/45525* (2013.01); *C23C 16/45536* (2013.01);
(Continued)

(58) Field of Classification Search
None
See application file for complete search history.

(56) References Cited

U.S. PATENT DOCUMENTS

2002/0037617 A1* 3/2002 Kim .................. H01L 21/28123
438/270
2009/0239390 A1 9/2009 Wu et al.
(Continued)

FOREIGN PATENT DOCUMENTS

CN 105990108 A 10/2016
CN 106057637 A 10/2016
(Continued)

OTHER PUBLICATIONS

WO International Search Report and Written Opinion issued in Application No. PCT/US2019/026355 on Jul. 24, 2019.
(Continued)

*Primary Examiner* — Francisco W Tschen
(74) *Attorney, Agent, or Firm* — Weaver Austin Villeneuve & Sampson LLP

(57) ABSTRACT

Methods and apparatuses for modifying a wafer surface using an organosilicon precursor are provided herein. The wafer surface is dosed with the organosilicon precursor following deposition of a dielectric material by an atomic layer deposition (ALD) process. In some implementations, the dielectric layer is made of silicon oxide. Dosing the wafer surface with the organosilicon precursor may occur in the same chamber as the ALD process. The organosilicon precursor may modify the wafer surface to increase its hydrophobicity so that photoresist adhesion is improved on
(Continued)

the wafer surface. In some implementations, the wafer surface may be exposed to an inert gas RF plasma after dosing the wafer surface with the organosilicon precursor.

14 Claims, 11 Drawing Sheets

(51) Int. Cl.
    *G03F 7/16*         (2006.01)
    *H01J 37/32*      (2006.01)
    *H01L 21/027*     (2006.01)

(52) U.S. Cl.
    CPC ........ *G03F 7/167* (2013.01); *H01J 37/32715* (2013.01); *H01J 37/32733* (2013.01); *H01L 21/02216* (2013.01); *H01L 21/0228* (2013.01); *H01L 21/0273* (2013.01); *H01J 2237/332* (2013.01)

(56) References Cited

U.S. PATENT DOCUMENTS

| | | |
|---|---|---|
| 2013/0295779 A1 | 11/2013 | Chandra et al. |
| 2013/0337583 A1 | 12/2013 | Kobayashi et al. |
| 2016/0093485 A1* | 3/2016 | Kobayashi ........ C23C 16/45542 438/763 |
| 2016/0216185 A1* | 7/2016 | Gottscho ........... H01J 37/32935 |
| 2016/0276148 A1* | 9/2016 | Qian ................. H01L 21/02164 |
| 2018/0005819 A1 | 1/2018 | Cheung et al. |
| 2021/0090883 A1* | 3/2021 | Citla ................. C23C 16/45536 |

FOREIGN PATENT DOCUMENTS

| | | |
|---|---|---|
| CN | 107393809 A | 11/2017 |
| KR | 20100100976 | 9/2010 |
| KR | 20180004011 A | 1/2018 |

OTHER PUBLICATIONS

KR Office Action dated Oct. 23, 2023, in KR Application No. 10-2020-7032219 with English Translation.
CN Office Action dated Jun. 29, 2024 in CN Application No. 201980025168.9 with English translation.

\* cited by examiner

MODIFYING HYDROPHOBICITY OF A WAFER SURFACE USING AN ORGANOSILICON PRECURSOR

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Patterning structures using photolithography continue to gain importance in semiconductor fabrication and advanced integrated circuit (IC) technology. Photoresist masks are patterned during photolithography, but photoresist masks may collapse or lift off depending on the adhesion between the photoresist masks and the underlying materials. Treatment methods have been developed and are being developed to promote adhesion between photoresist masks and underlying materials.

SUMMARY

Provided herein is a method for increasing hydrophobicity of a wafer surface. The method includes depositing a silicon-containing layer on a wafer by atomic layer deposition (ALD), and introducing a dose of an organosilicon precursor in a vapor phase onto a wafer surface to increase a hydrophobicity of the wafer surface.

In some implementations, the method further includes exposing the wafer to an RF plasma after introducing the dose of the organosilicon precursor. The RF plasma may include an inert gas plasma. An RF power applied to the RF plasma may be between about 100 W and about 1000 W. In some implementations, depositing the silicon-containing layer by ALD includes introducing a dose of a silicon-containing precursor onto the wafer surface and converting the silicon-containing precursor to form an adsorption-limited amount of the silicon-containing layer. In some implementations, depositing the silicon-containing layer by ALD and introducing the dose of the organosilicon precursor occurs in an ALD chamber without introducing a vacuum break. In some implementations, the method further includes depositing a photoresist on the surface of the silicon-containing layer after introducing the dose of the organosilicon precursor. In some implementations, a contact angle measurement on the wafer surface after introducing the dose of the organosilicon precursor is equal to or greater than about 40°. In some implementations, introducing the dose of the organosilicon precursor includes adsorbing the organosilicon precursor on the wafer surface without converting the organosilicon precursor in an atomic layer deposition cycle. In some implementations, the organosilicon precursor includes an aminosilane.

Another aspect involves an apparatus for increasing hydrophobicity of a wafer surface. The apparatus includes a processing chamber that includes a wafer support for supporting a wafer, and a controller including instructions for performing the following operations: (a) depositing, in the processing chamber, a silicon-containing layer on the wafer by atomic layer deposition (ALD), and (b) introducing, in the processing chamber, a dose of an organosilicon precursor in a vapor phase onto a wafer surface to increase a hydrophobicity of the wafer surface.

In some implementations, the silicon-containing layer includes a silicon nitride, a silicon carbide, a silicon oxide, or combinations thereof, and wherein introducing the dose of the organosilicon precursor comprises adsorbing the organosilicon precursor on the wafer surface without converting the organosilicon precursor in an atomic layer deposition cycle.

In some implementations, the controller further comprises instructions for performing the following operations: (c) exposing the wafer to an inert gas RF plasma. In some implementations, the controller further comprises instructions for performing the following operations: (d) transferring the wafer out of the processing chamber to a deposition chamber configured to deposit a photoresist on the silicon-containing layer.

These and other aspects are described further below with reference to the drawings.

DETAILED DESCRIPTION

Figure 1:
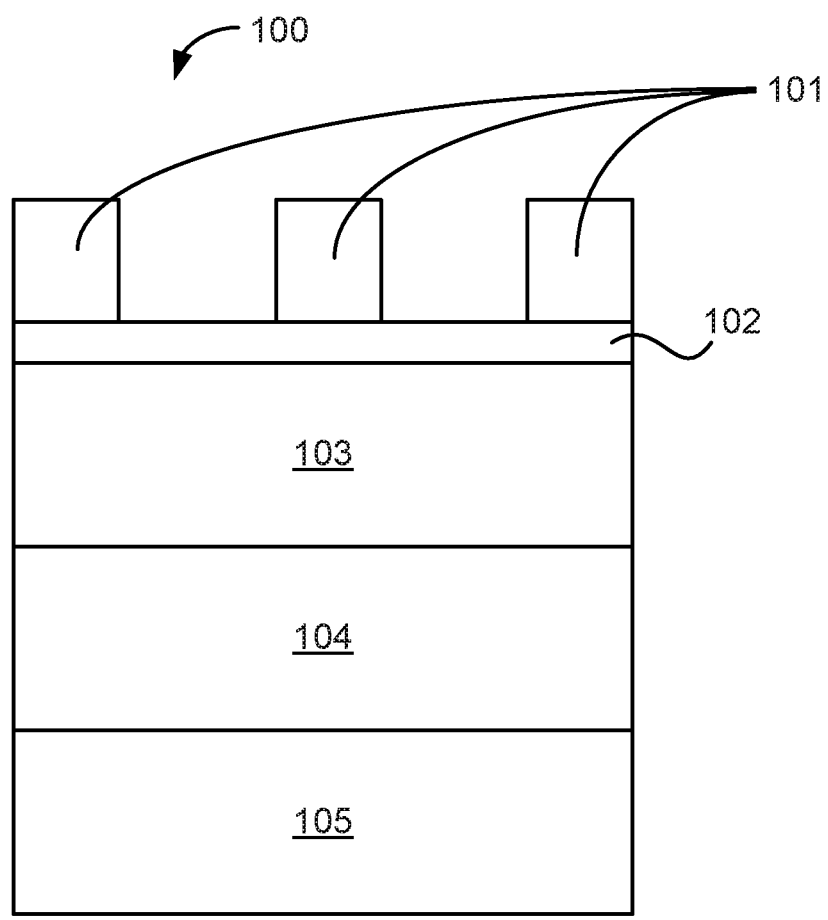
FIG. 1 is a schematic illustration of an example wafer having a treated surface layer and a patterned photoresist mask on the treated surface layer according to some implementations.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Photoresist Adhesion

Photoresist masks can be patterned to define features in underlying layers of a wafer. In a conventional photolithography process, a photoresist material is deposited on a wafer and then is exposed to light filtered by a reticle. The reticle is generally a glass plate that is patterned with feature geometries that block light from propagating through the reticle. After passing through the reticle, the light contacts the surface of the photoresist material and changes the chemical composition of the photoresist material such that a developer can remove a portion of the photoresist material. A developer is applied to the photoresist material to remove the portion of the photoresist material. The patterned photoresist material is used as a mask to etch underlying layers.

One of the challenges in photoresist patterning is proper adhesion between the photoresist material and an underlying material. Poor adhesion can lead to several adverse effects in patterning. Poor adhesion can result in undercutting, loss of resolution, reduced product yield, or possibly the complete loss of the photoresist pattern. Specifically, poor adhesion can result in collapse of the photoresist pattern or lifting off of the photoresist pattern. This can more easily occur with taller photoresist patterns formed on narrower bases. Subsequent etching and/or processing demand a high level of adhesion between the photoresist material and the underlying material.

Generally, a surface of a wafer is treated prior to deposition of the photoresist material to promote adhesion between the photoresist material and the underlying layer. For example, use of hexamethyldisilazane (HMDS) and vapor priming systems may promote adhesion to polysilicon, metals, silicon oxide ($SiO_x$) layers, and various other materials. Without being limited by any theory, an adhesion promoter such as HMDS may put down carbon-containing molecules on a wafer surface to modify the surface and make it more hydrophobic. Other common adhesion promoters may include trichlorophenylsilane, trichlorobenzene, and xylene. Such adhesion promoters may be applied by vapor plating in a bath process. In some implementations, an adhesion promoter such as spin-on polydimethylsiloxane (PDMS) may be deposited as an adhesive layer prior to deposition of the photoresist layer. Surface treatments are conventionally performed ex-situ from a deposition chamber for depositing the underlying layer.

FIG. 1 is a schematic illustration of an example wafer having a treated surface layer and a patterned photoresist mask on the treated surface layer according to some implementations. A wafer 100 includes a patterned photoresist mask 101 on a treated surface layer 102. The treated surface layer 102 is formed on a bulk layer 103, where an intermediate layer 104 underlies the bulk layer 103 and a bottom layer 105 underlies the intermediate layer 104. In some implementations, the patterned feature sizes of the patterned photoresist mask 101 may be equal to or less than about 120 nm, equal to or less than about 90 nm, equal to or less than about 60 nm, or equal to or less than about 50 nm.

In some implementations, the bulk layer 103 includes a dielectric material such as $SiO_x$. The treated surface layer 102 may also include the dielectric material except that the dielectric material is modified by a treatment. Examples of such treatments include modification by a silazane (e.g., HMDS), silane (trichlorophenylsilane), or siloxane (e.g., PDMS) as described above. Because a surface of the bulk layer 103 may be hydrophilic, one of the aforementioned treatments may modify the surface of the bulk layer 103 to become hydrophobic. In particular, the treated surface layer 102 that is formed at an interface between the patterned photoresist mask 101 and the bulk layer 103 is hydrophobic, thereby promoting adhesion between the patterned photoresist mask 101 and the bulk layer 103. The treatment may not affect the intermediate layer 104 or the bottom layer 105. In some implementations, treatment of the bulk layer 103 to form the treated surface layer 102 may include treating the bulk layer 103 with plasma to improve adhesion.

ALD-Integrated Surface Treatment

A treatment method of the present disclosure promotes adhesion between a photoresist material and an underlying material. The treatment method increases the hydrophobicity of the underlying material. The treatment method is integrated with an atomic layer deposition (ALD) process or plasma enhanced atomic layer deposition (PEALD) process when depositing the underlying material. By integrating the treatment method with the ALD process, processing time is reduced, throughput is improved, and product yield is increased. Furthermore, integrating the treatment method with the ALD process eliminates the use of separate chambers that would otherwise require transporting wafers from one chamber to another, which entails vacuum breaks that would increase the likelihood of unwanted materials coming into contact with the wafer. This may result in a loss of material functionality and/or integrity of the wafer.

The treatment method of the present disclosure may be performed in an ALD chamber or ALD tool. ALD is a technique that deposits thin layers of material using sequential self-limiting reactions. Typically, an ALD cycle includes operations to deliver and adsorb at least one reactant to a wafer surface, and then convert the adsorbed reactant to form a partial layer of film. Unlike a chemical vapor deposition (CVD) technique, ALD processes use surface-self-limited deposition reactions to deposit films on a layer-by-layer basis. A typical ALD cycle may include: (i) dosing that delivers and adsorbs precursor material onto a wafer surface, (ii) purging excess precursor material from the chamber and leaving a self-limited monolayer on the wafer surface, (iii) delivery of reactant material to react with the adsorbed precursor material, and (iv) purging of unreacted reactant material or reaction byproducts from the chamber. The dose step may adsorb precursor material in a self-limiting manner such that once active sites are occupied by the precursor material, little or no additional precursor material will be adsorbed on the wafer surface. The reactant material may likewise react with the precursor material in a self-limiting or absorption-limiting manner. Purge steps may be optionally performed to remove excess precursor material, reaction byproducts, and/or unreacted reactant material from the chamber, completing an ALD cycle.

Figure 2:
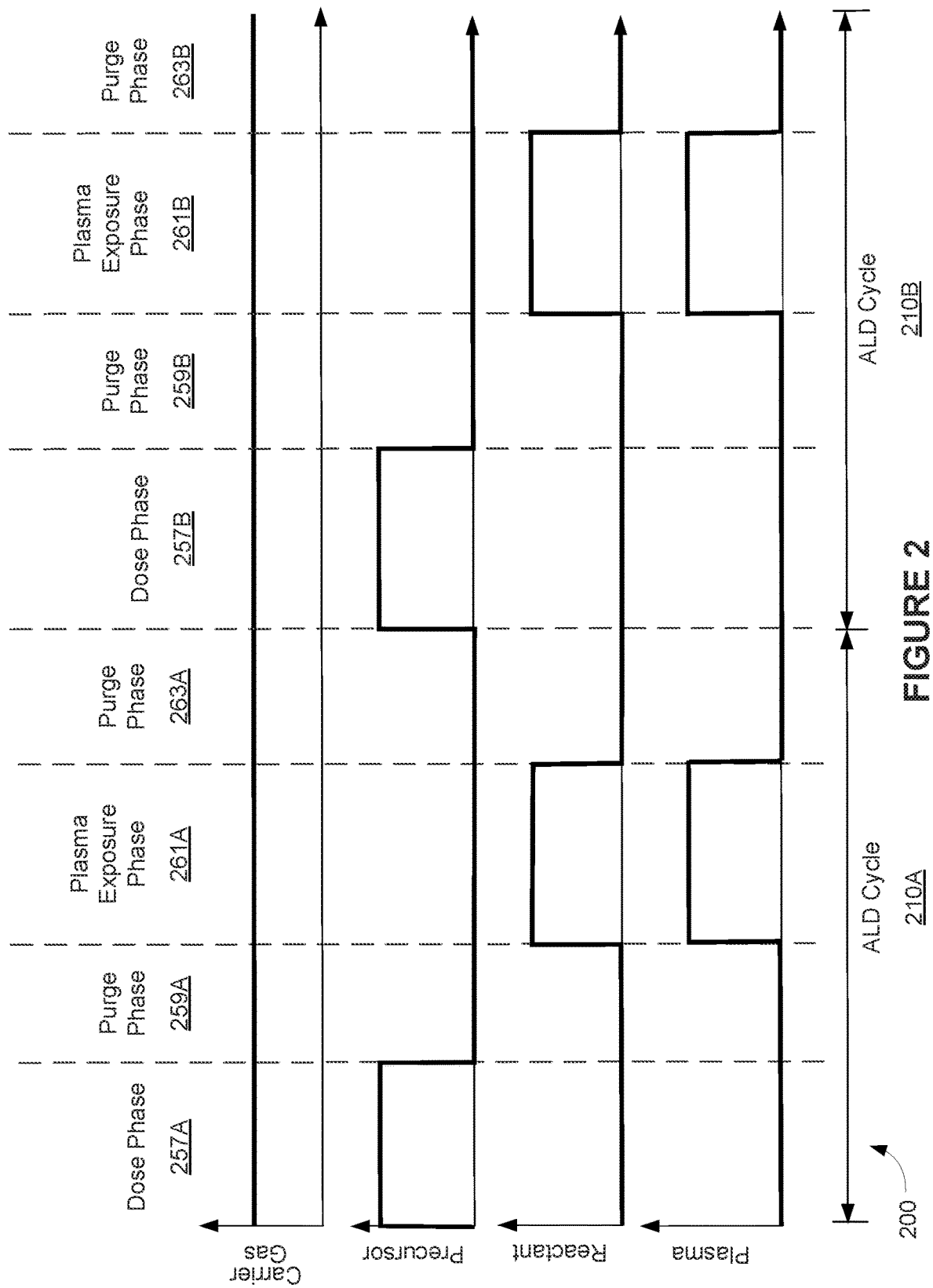
FIG. 2 is a timing sequence diagram showing an example of cycles in an atomic layer deposition (ALD) process.

FIG. 2 is a timing sequence diagram showing an example of cycles in an ALD process. FIG. 2 shows phases in a typical ALD process 200 for various process parameters, such as plasma, precursor flow, reactant flow, and carrier gas flow. Each of the ALD cycles in FIG. 2 may represent a PEALD cycle. The lines indicate when flow is turned on and off, or when plasma is turned on and off. Example process parameters include but are not limited to flow rates for precursor and reactant species, flow rates for carrier gas species, plasma power and frequency, wafer temperature, and process chamber pressure. In some implementations, the example in FIG. 2 is for depositing a film of $SiO_x$ using a silicon-containing precursor and oxygen plasma, where the reactant species is an oxygen-containing reactant used to convert an adsorbed precursor layer to form a film of $SiO_x$ on a wafer.

Any suitable number of deposition cycles may be included in an ALD process to deposit a desired thickness of a dielectric film. The timing sequence in FIG. 2 depicts two deposition cycles, 210A and 210B. Each deposition cycle 210A, 210B includes various phases. For example, during deposition cycle 210A, the wafer is exposed to a precursor during a dose phase 257A, and during deposition cycle 210B, the wafer is exposed to a precursor during a dose phase 257B. In some implementations, the precursor is a silicon-containing precursor. A precursor is a single reagent or mixture of reagents used to make the dielectric film, where the reagent or reagent mixture for depositing a silicon-containing film contains at least one silicon compound. In some implementations, a silicon-containing precursor may be, for example, a silane, a halosilane, or an aminosilane. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. Examples of halosilanes are iodosilanes, bromosilanes, chlorosilanes, and fluorosilanes, where specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tert-butylamino)silane ($SiH_2(NHC(CH_3)_3)_2$ (BTBAS)), tert-butyl silylcarbamate, $SiH(CH_3)$-$(N(CH_3)_2)_2$, $SiHCl$-$(N(CH_3)_2)_2$, $(Si(CH_3)_2NH)_3$ and the like. A further example of an aminosilane is trisilylamine ($N(SiH_3)$). During dose phases 257A and 257B, plasma is turned off and no reactant species is flowed to the wafer. In some implementations, the wafer is exposed to the precursor for a time between about 0.1 seconds and about 60 seconds, or between about 0.2 seconds and about 6 seconds, depending on the flow rate and the wafer surface area. In some implementations, a carrier gas or inert gas flows during the dose phases 257A and 257B.

In some implementations, the precursor adsorbs onto the wafer surface in a self-limiting manner such that once active sites are occupied by the precursor, little or no additional precursor will be adsorbed on the wafer surface. For example, precursor material may be adsorbed onto at least 60% of the wafer surface. Accordingly, the precursor material may fully or partially saturate the wafer surface. Molecules of this precursor are adsorbed onto the wafer surface, including chemisorbed species and/or physisorbed molecules of the precursor. During the dose phases 257A and 257B, the precursor material is adsorbed onto the wafer surface by one or both of chemisorption and physisorption. In most instances, the precursor material is adsorbed by both chemisorption and physisorption. When the precursor adsorbs onto active sites on the wafer surface, a thin layer of the precursor material forms on the surface. In various implementations, this layer may be less than a monolayer, and may have a thickness between about 0.1 Å and about 0.5 Å. Unlike a CVD or CVD-like process, the precursor does not decompose to form a thin film of dielectric material.

In purge phases 259A and 259B of the deposition cycles 210A and 210B, respectively, a process chamber is optionally purged to remove excess precursor material in the vapor phase that did not adsorb onto the surface of the wafer. Purging may involve a sweep gas, which may be a carrier gas used in other operations or a different gas. In some implementations, purging may involve evacuating the process chamber. During purge phases 259A and 259B, precursor flow is turned off and no plasma is ignited. Reactant species, such as oxygen-containing reactant, may or may not be supplied to the process chamber during purge phases 259A and 259B. In some implementations, a carrier gas may continue to flow to purge any excess precursor material from the process chamber. In some implementations, purge phases 259A and 259B may each include one or more evacuation subphases for evacuating the process chamber. Alternatively, it will be understood that each purge phase 259A and 259B may be omitted in some implementations. Each purge phase 259A and 259B may have any suitable duration, such as between about 0 seconds and about 60 seconds, or about 0.01 seconds. In some implementations, increasing a flow rate of one or more sweep gases may decrease the duration of each purge phase 259A and 259B. For example, a purge gas flow rate may be adjusted to various reactant thermodynamic characteristics and/or geometric characteristics of the process chamber and/or process chamber plumbing for modifying the duration of each purge phase 259A and 259B. In one non-limiting example, the duration of a sweep phase may be adjusted by modulating sweep gas flow rate. This may reduce deposition cycle time, which may improve wafer throughput. After a purge, at least some precursor material remains adsorbed on the wafer surface. At least some of the precursor material remains adsorbed on the wafer surface by chemisorption and physisorption.

A plasma may be ignited during plasma exposure phases 261A and 261B of the deposition cycles 210A and 210B, respectively. For example, the wafer may be exposed to oxygen plasma during plasma exposure phases 261A and 261B. It will be understood that reference to "oxygen plasma" includes plasma of any oxygen-containing reactant and is not limited to plasma of pure oxygen gas. Alternatively, the wafer may be exposed to nitrogen plasma during plasma exposure phases 261A and 261B, where reference to "nitrogen plasma" includes plasma of any nitrogen-containing reactant (e.g., ammonia) and is not limited to plasma of pure nitrogen gas. It will be understood that the plasma is not limited to oxygen plasma or nitrogen plasma, but may include plasma of any suitable reactant species. Flow of reactant species and plasma are both turned on during the plasma exposure phases 261A and 261B. In some implementations, flow of the reactant species may be turned on prior to turning on the plasma. Flow of precursor is turned off during plasma exposure phases 261A and 261B. In some implementations, carrier gas may continue to flow during the plasma exposure phases 261A and 261B. The wafer may be exposed to the plasma of the reactant species for a duration between about 0.1 seconds and about 60 seconds, or between about 0.2 seconds and about 6 seconds. In some implementations, plasma exposure phases 261A and 261B may have a duration that exceeds a time for plasma to interact with all precursors adsorbed on the wafer surface, forming a continuous film atop the wafer surface.

Example oxygen-containing reactants or oxidants include oxygen gas, water, carbon dioxide, carbon monoxide, nitrous oxide, nitric oxide, sulfur oxide, sulfur dioxide, oxygen-containing hydrocarbons, ozone, and combinations thereof. In some implementations, the wafer is exposed to the oxygen-containing reactant and a carrier gas simultaneously while the plasma is ignited. For example, oxygen gas is introduced along with helium, argon, or a mixture thereof to the wafer while the plasma is ignited.

Plasma energy is provided to activate the reactant species into ions, radicals, and other activated species, which react with the adsorbed layer of the precursor. For example, the plasma may directly or indirectly activate the gas phase molecules of the reactant species to form radicals or ions. Once the reactant species is activated to form plasma, the radicals and/or ions of the reactant species convert the adsorbed precursor into a dielectric film (e.g., $SiO_x$) on the surface of the wafer.

In some implementations, the plasma is an in-situ plasma, such that the plasma is formed directly above the wafer surface in the process chamber. The in-situ plasma may be ignited at a power per wafer area between about 0.2 Watts/$cm^2$ and about 2.1 Watts/$cm^2$. For example, the power may range from about 100 Watts to about 10,000 Watts, or from about 150 Watts to about 6,000 Watts, or from about 600 Watts to about 4000 Watts. For example, plasmas for ALD processes may be generated by applying an RF field to a gas using capacitively coupled plates or with a remote plasma source. In the case of capacitive coupled plasma, ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition and conversion process. It will be understood that the RF field may be coupled via any suitable electrodes. In various implementations, a high frequency plasma is used having a frequency of at least about 13.56 MHz, or at least about 27 MHz, or at least about 40 MHz, or at least about 60 MHz. In some implementations, a microwave-based plasma may be used. Non-limiting examples of electrodes include process gas distribution showerheads and wafer support pedestals. It will be understood that plasmas for ALD processes may be formed by one or more suitable methods other than capacitive coupling of an RF field to a gas. In some implementations, the plasma is a remote plasma, such that the reactant species is ignited in a remote plasma generator positioned upstream of the process chamber, then is delivered to the process chamber where the wafer is housed. In some implementations, other types of plasma may be used, such as inductively-coupled plasmas instead of capacitively-coupled plasmas.

Though the timing sequence diagram in FIG. 2 shows plasma exposure phases 261A and 261B for converting adsorbed precursor material, it will be understood that thermal conversion phases may replace plasma exposure phases 261A and 261B. During thermal conversion phases, the wafer surface is exposed to reactant species at an elevated temperature. The elevated temperature may be applied to the wafer via a wafer support or pedestal. In some implementations, the elevated temperature can be equal to or greater than about 400° C. At the elevated temperature, the reactant species may undergo a dissociation reactant, and the dissociated species can react with the adsorbed precursor to convert the adsorbed precursor to a dielectric film (e.g., $SiO_x$). The heat at the elevated temperature can thermodynamically drive adsorbed reactants to undergo a surface chemical reaction to form a stable thin film. In some implementations, the reactant species in the thermal conversion phases can include an oxygen-containing reactant or a nitrogen-containing reactant.

In purge phases 263A and 263B of deposition cycles 210A and 210B, respectively, the process chamber is optionally purged to remove reaction byproducts and/or unreacted reactant material from the process chamber. The plasma is extinguished or the elevated temperature is turned off during purge phases 263A and 263B. The precursor flow is turned off and no plasma is ignited. Reactant species may or may not be supplied to the process chamber during purge phases 263A and 263B. In some implementations, the purge may be performed by flowing the carrier gas or any other inert gas.

Performing operations 257A, 259A, 261A, and 263A may constitute an ALD cycle, such as the deposition cycle 210A. If the deposited dielectric film is not an adequate thickness or desired thickness, then the ALD cycle may be repeated as shown in the deposition cycle 210B. ALD cycles may be repeated until an adequate or desired thickness of the dielectric film is formed.

Figure 3:
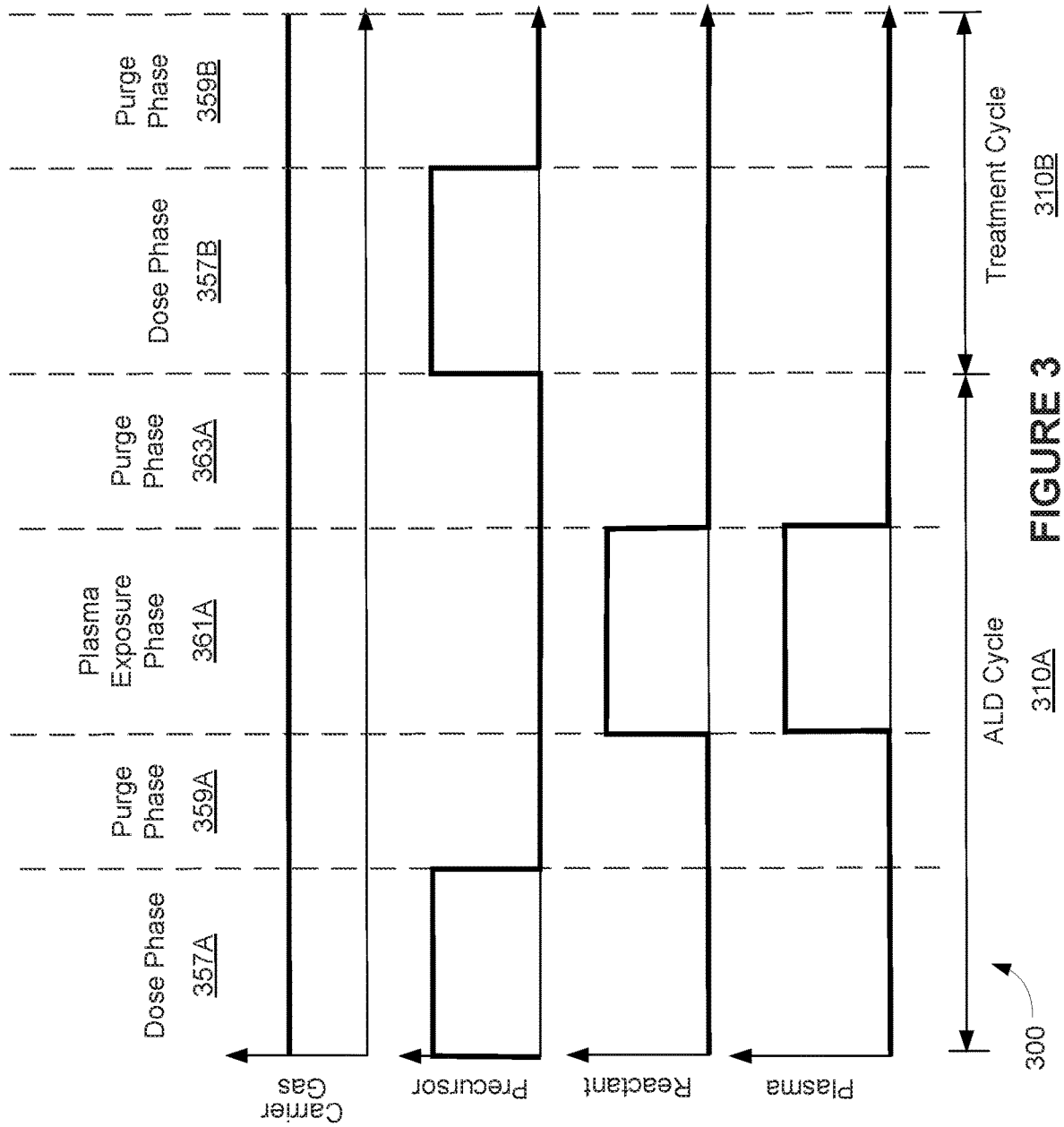
FIG. 3 is a timing sequence diagram showing an example of a cycle in an ALD process followed by a treatment cycle to treat a surface of an ALD-deposited layer according to some implementations.

FIG. 3 is a timing sequence diagram showing an example of a cycle of an ALD process followed by a treatment cycle to treat a surface of an ALD-deposited layer according to some implementations. FIG. 3 shows phases in an ALD process 300 for various process parameters such as plasma, precursor flow, reactant flow, and carrier gas flow. The lines indicate when flow is turned on and off, or when plasma is turned on and off. Example process parameters include but are not limited to flow rates for precursor and reactant species, flow rates for carrier gas species, plasma power and frequency, wafer temperature, and process chamber pressure. In some implementations, an example in FIG. 3 can be for depositing a film of $SiO_x$ using a silicon-containing precursor and oxygen plasma, where the reactant species is an oxygen-containing reactant used to convert adsorbed precursor material to form a film of $SiO_x$ on a wafer.

Similar to the timing sequence diagram in FIG. 2, the timing sequence diagram in FIG. 3 includes a dose phase 357A, an optional purge phase 359A, a plasma exposure phase 361A, and an optional purge phase 363A that may constitute an ALD cycle, such as a deposition cycle 310A. Each of the operations 357A, 359A, 361A, and 363A may be identical or similar to the operations 257A, 259A, 261A, and 263A described in FIG. 2. In some implementations, a thermal conversion phase may replace the plasma exposure phase 361A for converting adsorbed precursor material on a wafer surface. If a deposited dielectric film is not an adequate thickness or desired thickness, then the ALD cycle may be repeated until an adequate or desired thickness is achieved.

Unlike the timing sequence diagram in FIG. 2, the timing sequence diagram in FIG. 3 follows the deposition cycle 310A with a treatment cycle 310B. The treatment cycle 310B includes a dose phase 357B following the deposition cycle 310A. In some implementations, the dose phase 357B is followed by an optional purge phase 359B. The treatment cycle 310B mimics one or more phases of an ALD cycle and essentially constitutes a partial ALD cycle. The treatment cycle 310B may be performed in the same ALD chamber or tool as the deposition cycle 310A for depositing the dielectric film so that no vacuum break is introduced between deposition and treatment operations. Therefore, the treatment cycle 310B is part of the ALD process 300 and may be referred to as an ALD-integrated surface treatment.

During treatment cycle 310B, the wafer is exposed to an organosilicon precursor during the dose phase 357B. The organosilicon precursor is a single reagent or a mixture of reagents used to treat the ALD-deposited dielectric film. The organosilicon precursor may include one or more silicon atoms and at least one hydrocarbon framework. In some implementations, the organosilicon precursor includes an alkyl silane. In some implementations, the organosilicon precursor includes an aminosilane. Examples of aminosilanes are butylaminosilane, methylaminosilane, diethylaminosilane, tert-butylsilanamine, bis-tertbutylaminosilane, bis-diethylaminosilane, and the like. During the dose phase 357B, plasma is turned off and no reactant species is flowed to the wafer. In some implementations, the wafer is exposed to the precursor for a time between about 0.1 seconds and about 60 seconds, or between about 0.2 seconds and about 6 seconds, depending on the flow rate and the wafer surface area. In some implementations, a carrier gas or inert gas flows during the dose phase 357B.

The adsorbed organosilicon precursor on the wafer surface from the dose phase 357B modifies the wafer surface to increase its hydrophobicity. Without being limited by any theory, the adsorbed organosilicon precursor may increase carbon content on the wafer surface to increase its hydrophobicity, thereby providing improved adhesion between a subsequently-deposited photoresist material and the ALD-deposited dielectric film.

In some implementations, the organosilicon precursor adsorbs onto the wafer surface in a self-limiting manner such that once active sites are occupied by the organosilicon precursor, little or no additional organosilicon precursor will be adsorbed on the wafer surface. For example, organosilicon precursor material may be adsorbed onto at least 60% of the wafer surface. When the organosilicon precursor adsorbs onto active sites on the wafer surface, a thin layer of the organosilicon precursor material forms on the surface. In various implementations, this layer may be less than a monolayer, and may have a thickness between about 0.1 Å and about 100 Å, or between about 0.5 Å and about 20 Å, or between about 0.9 Å and about 6 Å. The thin layer of the organosilicon precursor material may have a thickness not greater than a hydrodynamic radius of the organosilicon precursor molecule, or the equivalent of one monolayer of the surface-adsorbed organosilicon precursor molecule. Unlike a CVD or CVD-like process, the organosilicon precursor does not decompose to form a thin film of dielectric material. Moreover, unlike an ALD process, the organosilicon precursor is not converted to form a thin film of dielectric material.

In some implementations, the purge phase 359B may follow the dose phase 357B to optionally purge excess organosilicon precursor in the vapor phase that did not adsorb onto the surface of the wafer. Purging may involve a sweep gas, which may be a carrier gas used in other operations or a different gas. In some implementations, purging may involve evacuating the process chamber. During purge phase 359B, precursor flow is turned off and no plasma is ignited. In some implementations, a carrier gas may continue to flow to purge any excess precursor material from the process chamber. In some implementations, purge phase 359B may include one or more evacuation subphases for evacuating the process chamber. Alternatively, it will be understood that the purge phase 359B may be omitted in some implementations. The purge phase 359B may have a suitable duration, such as between about 0 seconds and about 60 seconds, or about 0.01 seconds. After a purge, at least some organosilicon precursor material remains adsorbed on the wafer surface. Specifically, at least some of the organosilicon precursor material remains adsorbed on the wafer surface by chemisorption and physisorption.

The ALD process 300 for deposition and treatment of the ALD-deposited dielectric film terminates with the treatment cycle 310B. The adsorbed organosilicon precursor from the dose phase 357B is not subsequently converted using any reactant species, whether by plasma conversion, thermal conversion, or other techniques for converting the adsorbed organosilicon precursor. The adsorbed organosilicon precursor modifies the wafer surface to increase its hydrophobicity. In some implementations, the dose phase 357B or the purge phase 359B is optionally followed by a plasma exposure operation that does not convert the adsorbed organosilicon precursor. The wafer may be exposed to a low-power inert gas plasma to modulate or otherwise tune the hydrophobicity of the wafer surface. The aforementioned plasma exposure operation may be performed in the same ALD chamber or tool as the deposition cycle 310A and the treatment cycle 310B so that no vacuum break is introduced from the plasma exposure operation.

Figure 4:
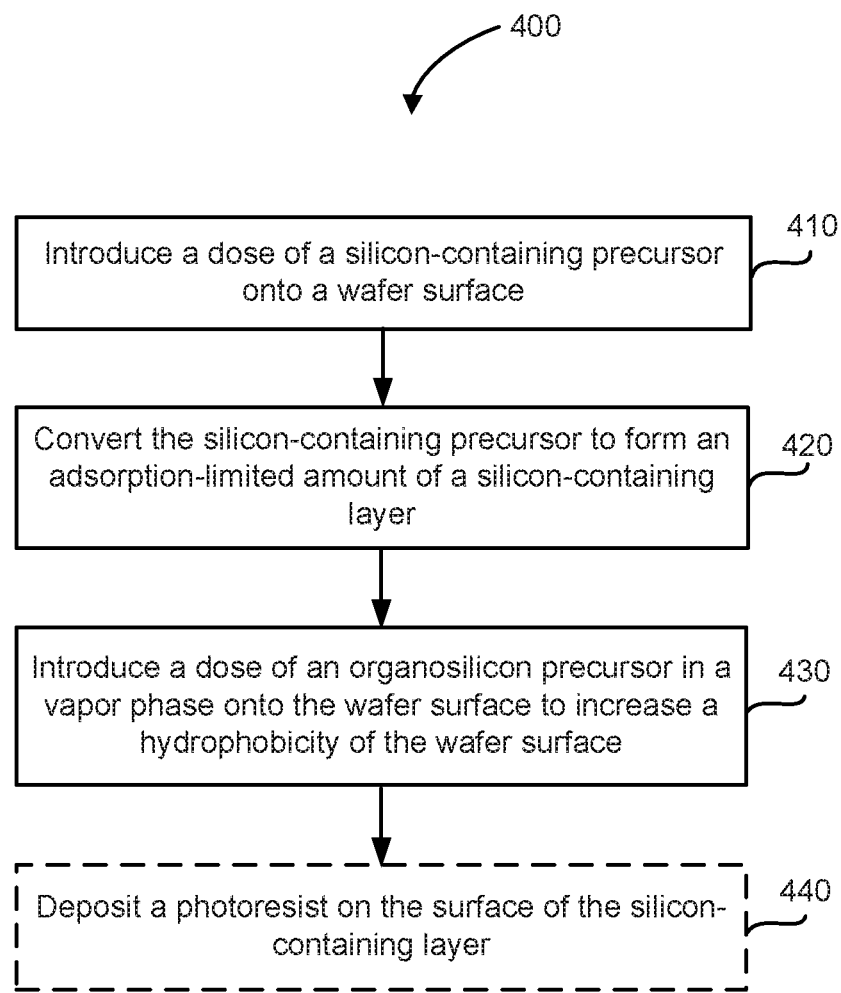
FIG. 4 is a flow diagram of an example method for increasing hydrophobicity of a wafer surface according to some implementations.

FIG. 4 is a flow diagram of an example method for increasing hydrophobicity of a wafer surface according to some implementations. The operations in a process 400 may be performed in different orders and/or with different, fewer, or additional operations.

At block 410 of the process 400, a dose of a silicon-containing precursor is introduced onto a wafer surface. Example chemistries of the silicon-containing precursor are described above. The silicon-containing precursor is delivered to the wafer surface to adsorb on the wafer surface in a self-limiting manner. Introducing the dose of the silicon-containing precursor may be part of an ALD cycle as described above. In some implementations, the silicon-containing precursor may be delivered at a flow rate between about 20 sccm and about 5000 sccm, or between about 1000 sccm and about 4000 sccm. In some implementations, the wafer is exposed to the silicon-containing precursor for a duration between about 0.1 seconds and about 60 seconds, or between about 0.2 seconds and about 6 seconds. During introduction of the dose of the silicon-containing precursor, plasma is turned off and no reactant species for converting the silicon-containing precursor is flowed to the wafer.

At block 420 of the process 400, the silicon-containing precursor is converted to form an adsorption-limited amount of a silicon-containing layer. In some implementations, the silicon-containing layer includes a silicon nitride, a silicon carbide, a silicon oxide, or combinations thereof. Reactant species may be flowed to the wafer during conversion. The silicon-containing precursor adsorbed on the wafer surface may be converted by reacting with the reactant species to form the silicon-containing layer. In some implementations, the reactant species includes an oxygen-containing reactant such as oxygen gas or ozone. In some implementations, the reactant species includes a nitrogen-containing reactant such as nitrogen gas or ammonia. In some implementations, the silicon-containing precursor is converted by plasma exposure where a plasma is ignited. In some implementations, the silicon-containing precursor is converted by thermal conversion via an elevated temperature.

Dosing the wafer with the silicon-containing precursor at block 410 and converting the silicon-containing precursor at block 420 may be performed in the same process chamber without introducing a vacuum break in between operations. The dose operation at block 410 and the conversion operation at block 420 may be repeated until a desired thickness of the silicon-containing layer is formed. Performing the dose operation at block 410 and the conversion operation at block 420 may constitute depositing the silicon-containing layer on the wafer by an ALD process or ALD cycle.

An optional purge operation may be performed between the dose operation at block 410 and the conversion operation at block 420. The purge operation may sweep purge gas to remove excess silicon-containing precursor in the vapor phase from the process chamber.

In some implementations, the wafer surface includes a hydrophobic layer on the silicon-containing layer. Surface treatment of the silicon-containing layer may occur prior to introducing a dose of an organosilicon precursor. For example, the silicon-containing layer may be treated with HMDS, PDMS, or other adhesion promoter to form the hydrophobic layer or to at least modify the surface of the silicon-containing layer. In some implementations, the process 400 further includes depositing the hydrophobic layer on the silicon-containing layer before introducing the dose of the organosilicon precursor. That way, introducing the organosilicon precursor in combination with the hydrophobic layer can serve to further increase the hydrophobicity of the wafer surface. An example of a hydrophobic layer is a treated surface layer 102 shown in FIG. 1. The hydrophobic layer may be a hydro-silazane treated surface prior to introducing the organosilicon precursor.

At block 430 of the process 400, a dose of an organosilicon precursor is introduced in a vapor phase onto the wafer surface to increase a hydrophobicity of the wafer surface. In some implementations, the organosilicon precursor may be different than the silicon-containing precursor introduced at block 410. In some implementations, the organosilicon precursor includes an alkyl silane. In some implementations, the organosilicon precursor includes an aminosilane.

Figure 5:
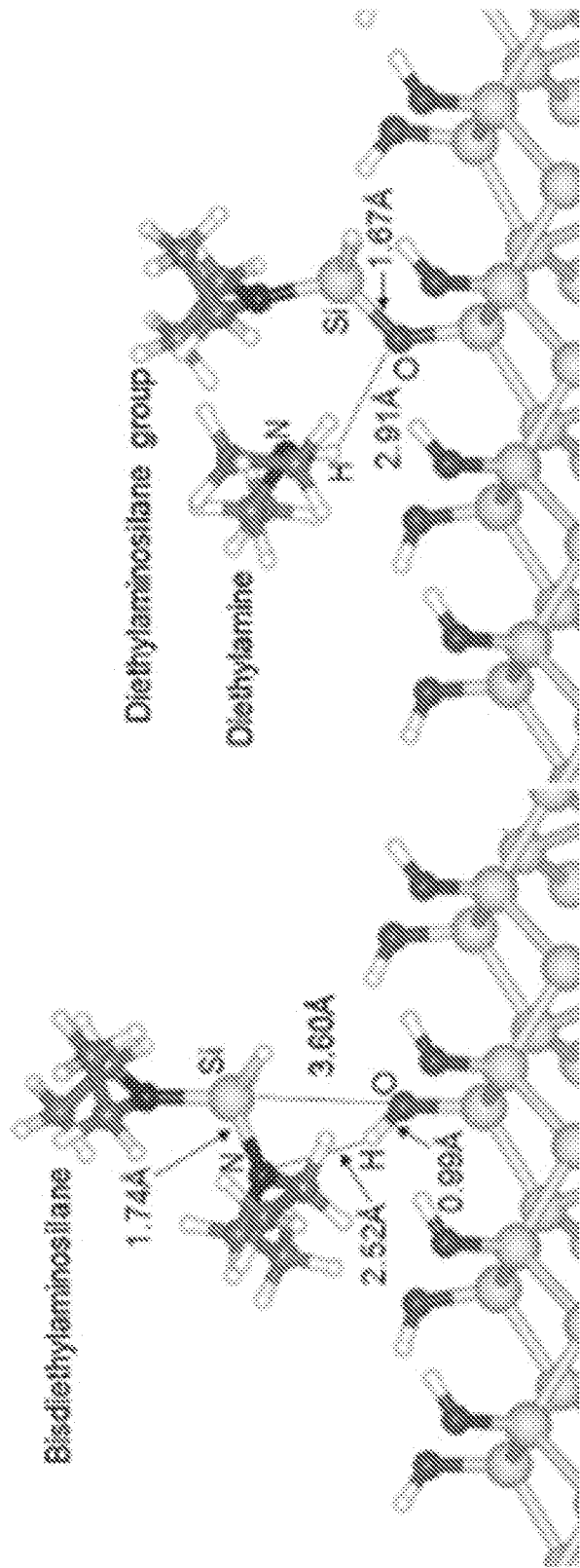
FIG. 5 shows schematic illustrations of possible bonding interactions between an aminosilane precursor and a silicon surface according to some implementations.

FIG. 5 shows schematic illustrations of possible bonding interactions between an aminosilane precursor and a silicon surface according to some implementations. As shown in FIG. 5, the silicon surface may include a silicon oxide surface. The silicon oxide surface includes hydroxyl end groups, which may be formed from ambient air ($H_2O$ and $O_2$) or from a mild etchant such as hydrofluoric acid (HF) in $H_2O$. The hydroxyl end groups on the silicon oxide surface may be susceptible to reacting with organosilicon precursors. In FIG. 5, Si—OH bonds from the silicon oxide surface may interact with a bis-diethylaminosilane precursor. Without being limited by any theory as to how the bis-diethylaminosilane precursor interacts with the silicon oxide surface, a diethylamine group may break off from the bis-diethylaminosilane precursor, leaving a diethylaminosilane group. The Si—N—R bonds in the diethylaminosilane group may attach to Si—O bonds from the silicon oxide surface. This kind of reaction mechanism is discussed in Baek, Seung-Bin, Dae-Hee Kim, and Yeong-Cheol Kim, "Adsorption and surface reaction of bis-diethylaminosilane as a Si precursor on an OH-terminated Si (001) surface," Applied Surface Science (2012), pgs. 6341-6344; which is incorporated by reference in its entirety and for all purposes. And without being limited by any theory as to why the bis-diethylaminosilane precursor results in increased hydrophobicity, the diethylaminosilane group that terminates on the silicon oxide surface may provide a high wetting angle with water, thereby providing a surface with relatively high hydrophobicity.

Returning to FIG. 4, introducing the dose of the organosilicon precursor occurs in the same ALD chamber as depositing the silicon-containing layer by ALD without introducing a vacuum break in between operations. Specifically, introducing the dose of the organosilicon precursor at block 430 occurs in the same ALD chamber as introducing the dose of the silicon-containing precursor at block 410 and converting the silicon-containing precursor at block 420. Thus, introducing the dose of the organosilicon precursor is part of a surface treatment operation that is integrated with the ALD process for depositing the silicon-containing layer. Such a surface treatment operation is not performed in a separate chamber from the ALD process. In fact, the surface treatment operation corresponds to a dose phase of an ALD cycle and can be performed by ALD mechanisms. The ALD process can conclude with the dose phase involving the organosilicon precursor. In some implementations, introducing the dose of the organosilicon precursor includes adsorbing the organosilicon precursor on the wafer surface without converting the organosilicon precursor in an ALD cycle. In other words, the ALD cycle of the surface treatment operation does not include a thermal conversion or a plasma conversion phase involving reactant species such as a nitrogen-containing reactant or an oxygen-containing reactant to react with the organosilicon precursor.

The organosilicon precursor may adsorb on the surface of the silicon-containing layer to modify the surface of the silicon-containing layer and increase its hydrophobicity. To measure hydrophobicity, a contact angle measurement can be taken. A contact angle can be measured by using a contact angle goniometer on a drop of water placed on a wafer surface. The contact angle is the angle between the horizontal wafer surface and a tangent drawn along the curvature of the water droplet at the edge of the water droplet. The contact angle can approach zero degrees when the water droplet wets the wafer surface well and the tangent line is nearly flat. A higher contact angle is indicative of a hydrophobic surface and a lower contact angle is indicative of a hydrophilic surface. In some implementations, a contact angle measurement of the wafer surface after the surface treatment operation is equal to or greater than 30°, equal to or greater than 35°, equal to or greater than 40°. A more hydrophobic surface can provide sufficient adhesion between the silicon-containing layer and a photoresist.

Figure 6A:
FIG. 6A shows a contact angle measurement for an ALD-deposited silicon oxide ($SiO_x$) film without treatment.
Figure 6B:
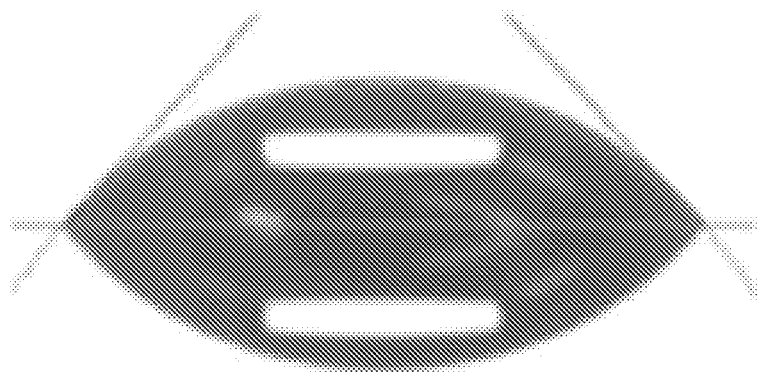
FIG. 6B shows a contact angle measurement for an ALD-deposited $SiO_x$ film after treatment according to some implementations.

FIG. 6A shows a contact angle measurement for an ALD-deposited silicon oxide ($SiO_x$) film without treatment. The contact angle measurement without any surface treatment on ALD-deposited $SiO_x$ was approximately 5°. FIG. 6B shows a contact angle measurement for an ALD-deposited $SiO_x$ film after treatment according to some implementations. The contact angle measurement with an ALD-integrated surface treatment involving an aminosilane precursor on an ALD-deposited $SiO_x$ film was approximately 46.2°. The ALD-integrated surface treatment was not followed by any exposure to an RF plasma. The ALD-integrated surface treatment dosed the wafer surface with the aminosilane precursor for 0.25 seconds at a flow rate of 1250 sccm in a chamber pressure of 3 Torr.

Returning to FIG. 4, at block 440 of the process 400, a photoresist is optionally deposited on the surface of the silicon-containing layer. The surface of the silicon-containing layer is hydrophobic and provides improved adhesion of the photoresist to the silicon-containing layer. In some implementations, prior to depositing the photoresist, the process further includes transferring the wafer outside of the ALD chamber or tool to a deposition chamber configured to deposit the photoresist on the silicon-containing layer. The photoresist may be patterned and the silicon-containing layer may be etched without having the photoresist collapse or lifted off. The improved adhesion between the photoresist and the silicon-containing layer further improves throughput and product yield.

In some implementations, the process 400 further includes exposing the wafer to an RF plasma after introducing the dose of the organosilicon precursor. The RF plasma may include an inert gas plasma such as an argon plasma. Furthermore, the RF plasma is a low power plasma, where the RF power applied to the RF plasma is between about 100 W and about 1000 W, or between about 100 W and about 500 W. Applying a low power inert gas plasma minimizes conversion of the adsorbed organosilicon precursor. That way, the RF plasma does not convert or only partially converts the adsorbed organosilicon precursor on the wafer surface.

Exposure to the RF plasma may further treat the wafer surface to modulate or tune its hydrophobicity. It will be understood that exposure to the RF plasma may have additional effects on the wafer surface and the silicon-containing layer with the adsorbed organosilicon precursor. For example, exposure to the RF plasma may stabilize the silicon-containing layer. In addition or in the alternative, exposure to the RF plasma may activate cross-linking or polymerization of the silicon-containing layer.

By adjusting conditions of the RF plasma, the wafer surface may become more hydrophobic or less hydrophobic. Parameters such as RF power, chamber pressure, wafer temperature, chamber temperature, number of treatment cycles, treatment cycle duration, RF exposure time, and gas composition may influence the effects of the RF plasma on a hydrophobicity of the wafer surface. In some implementations, the chamber pressure is between about 0.5 Torr and about 5 Torr. Higher chamber pressures may result in decreasing contact angle measurements, which correlates to decreasing hydrophobicity. In some implementations, the RF exposure time is between about 0.25 seconds and about 50 seconds. Increased RF exposure times may result in decreasing contact angle measurements, which correlates to decreasing hydrophobicity. In some implementations, the number of treatment cycles is between about 1 cycle and 7 cycles. Increased number of treatment cycles may result in decreasing contact angle measurements, which correlates to decreasing hydrophobicity. Exposure to the RF plasma may reduce the hydrophobicity of the wafer surface compared to the hydrophobicity of the wafer surface following adsorption of the organosilicon precursor.

Figure 6C:
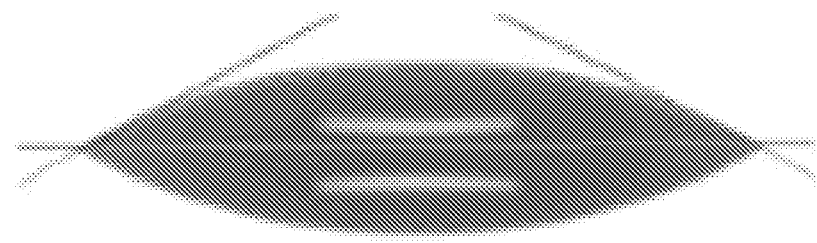
FIG. 6C shows a contact angle measurement for an ALD-deposited $SiO_x$ film after treatment according to some other implementations.

FIG. 6C shows a contact angle measurement for an ALD-deposited $SiO_x$ film after treatment according to some other implementations. The contact angle measurement with an ALD-integrated surface treatment involving an aminosilane precursor on an ALD-deposited $SiO_x$ film was approximately 27° when the ALD-integrated surface treatment was followed by exposure to an argon RF plasma. Exposure to the argon RF plasma involved an RF power of 1000 W for an RF exposure time of 1 second. The ALD-integrated surface treatment with RF plasma exposure in FIG. 6C had a higher contact angle measurement than FIG. 6A but a lower contact angle measurement than FIG. 6B. Thus, the effect on hydrophobicity by the ALD-integrated surface treatment can be moderated by RF plasma exposure. The RF plasma exposure may be tailored in a manner to achieve a desired hydrophobicity on the wafer surface. Various parameters of the RF plasma exposure can be adjusted to control the hydrophobicity of the wafer surface as shown in FIGS. 7A-7C.

Figure 7A:
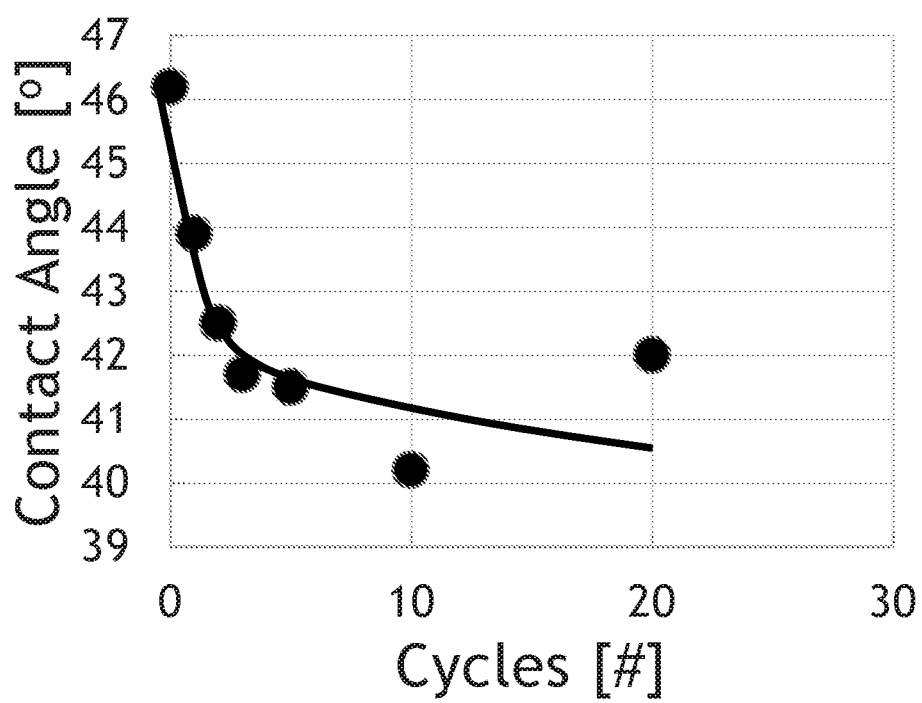
FIG. 7A shows contact angle measurements as a function of a number of treatment cycles where each treatment cycle includes a dose step and an RF plasma exposure step according to some implementations.

FIG. 7A shows contact angle measurements as a function of number of treatment cycles where each treatment cycle includes a dose step and an RF plasma exposure step according to some implementations. Each treatment cycle represents at least an organosilicon precursor dose phase and an inert gas plasma exposure phase. Each treatment cycle in FIG. 7A used a bis-diethylaminosilane precursor for a dose time of 0.25 seconds, and an argon plasma at an RF power of 400 W for an RF exposure time of 0.25 seconds at a chamber pressure of 3 Torr. In FIG. 7A, as the number of treatment cycles increased, the contact angle decreased.

Figure 7B:
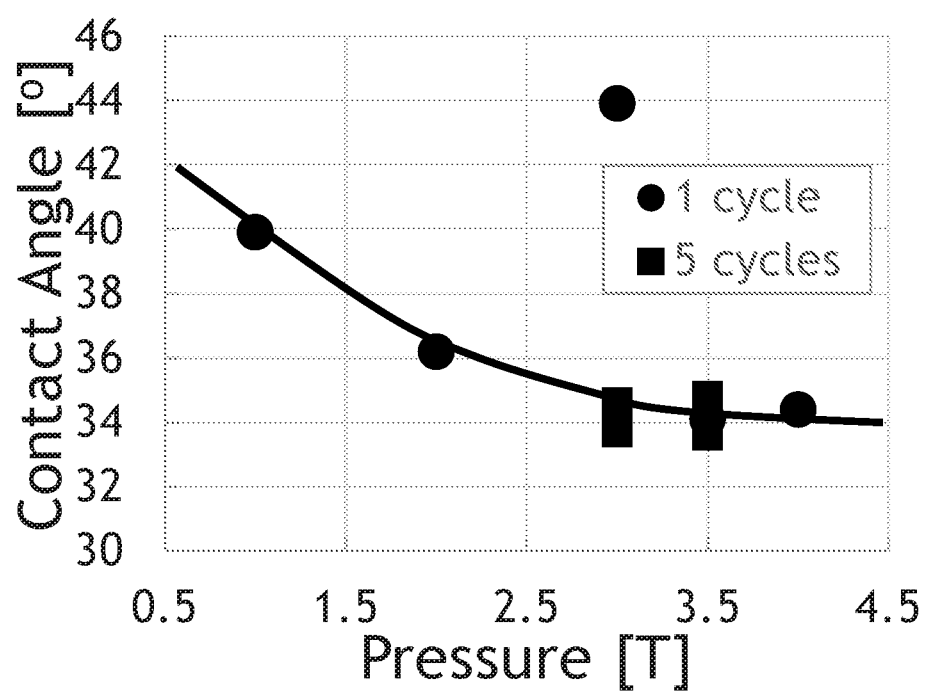
FIG. 7B shows contact angle measurements as a function of chamber pressure during treatment cycles where each treatment cycle includes a dose step and an RF plasma exposure step according to some implementations.

FIG. 7B shows contact angle measurements as a function of chamber pressure during treatment cycles where each treatment cycle includes a dose step and an RF plasma exposure step according to some implementations. Each treatment cycle represents at least an organosilicon precursor dose phase and an inert gas plasma exposure phase. Each treatment cycle in FIG. 7B used a bis-diethylaminosilane precursor for a dose time of 0.25 seconds, and an argon plasma at an RF power of 400 W for an RF exposure time of 0.25 seconds for 1 cycle and for 5 cycles. In FIG. 7B, as the chamber pressure increased, the contact angle decreased. The contact angle stabilizes at about 34° with increasing chamber pressure.

Figure 7C:
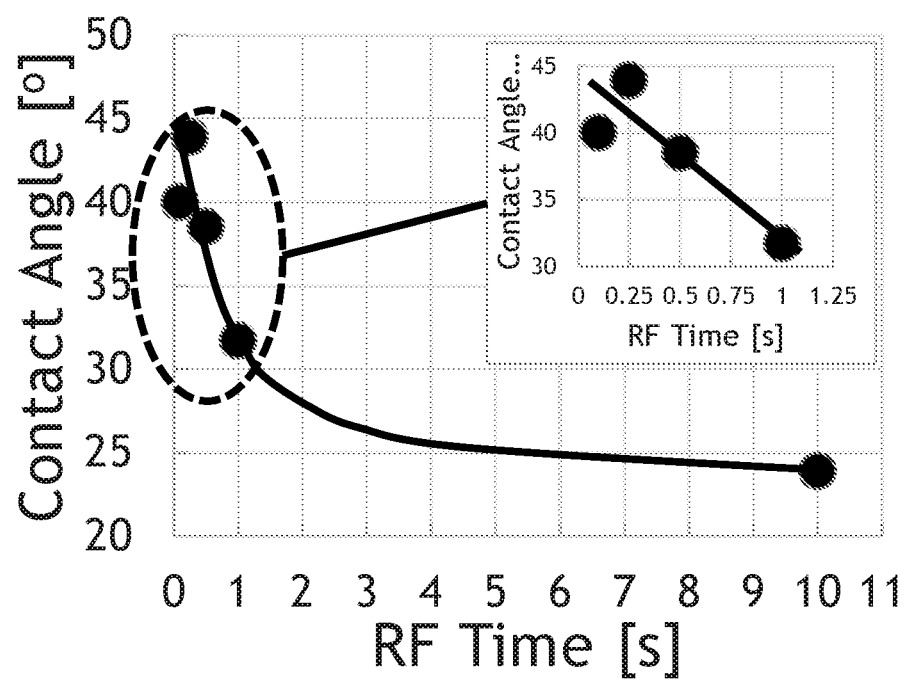
FIG. 7C shows contact angle measurements as a function of RF exposure time during treatment cycles where each treatment cycle includes a dose step and an RF plasma exposure step according to some implementations.

FIG. 7C shows contact angle measurements as a function of RF exposure time during treatment cycles where each treatment cycle includes a dose step and an RF plasma exposure step according to some implementations. Each treatment cycle represents at least an organosilicon precursor dose phase and an inert gas plasma exposure phase. Each treatment cycle in FIG. 7C used a bis-diethylaminosilane precursor for a dose time of 0.25 seconds, and an argon plasma at an RF power of 400 W for 1 cycle. In FIG. 7C, as the RF exposure time increased, the contact angle decreased. The contact angle stabilizes at about 24° with increasing RF exposure time.

Apparatus

Figure 8:
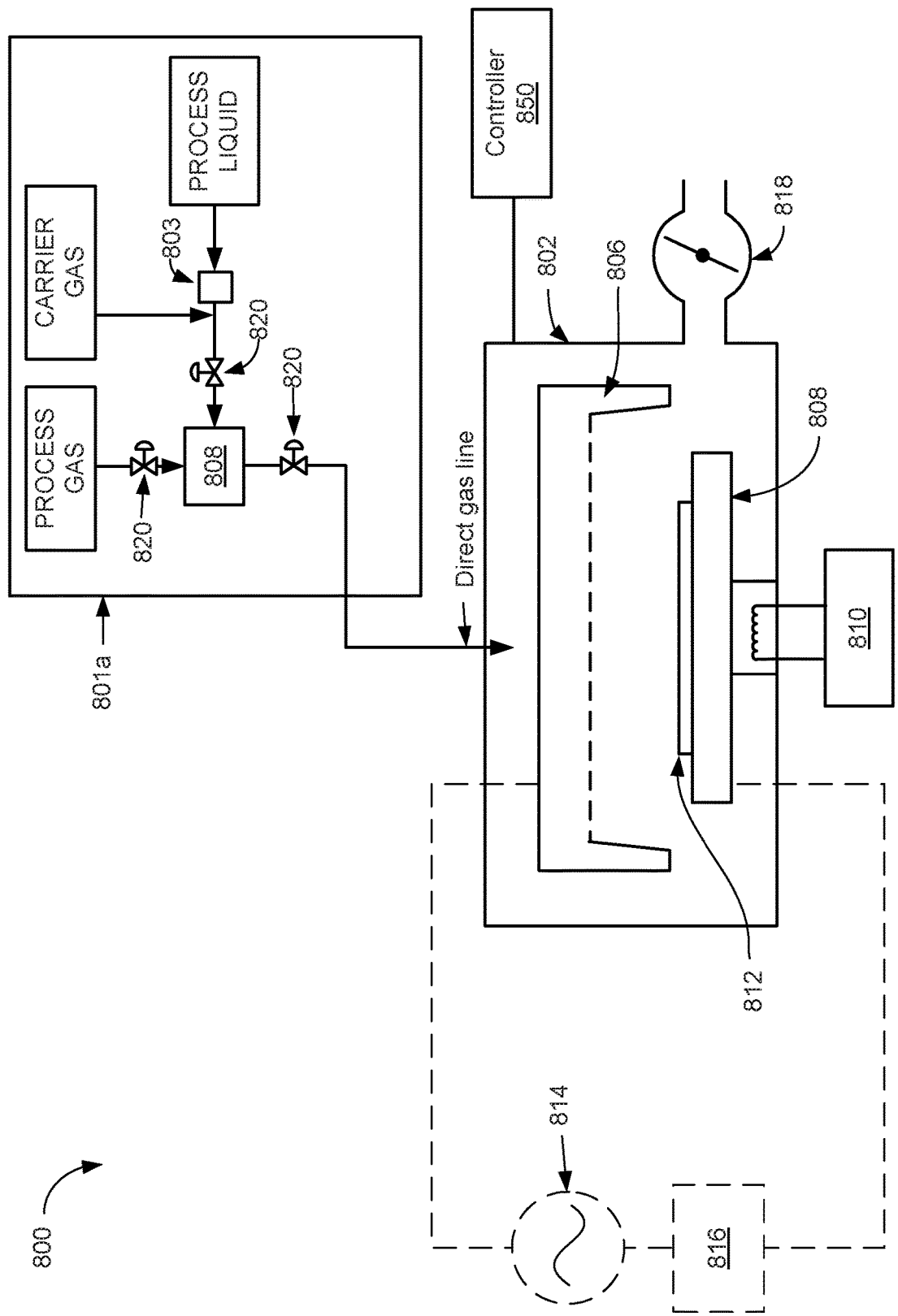
FIG. 8 is a schematic diagram of an example process chamber for performing disclosed implementations.
Figure 9:
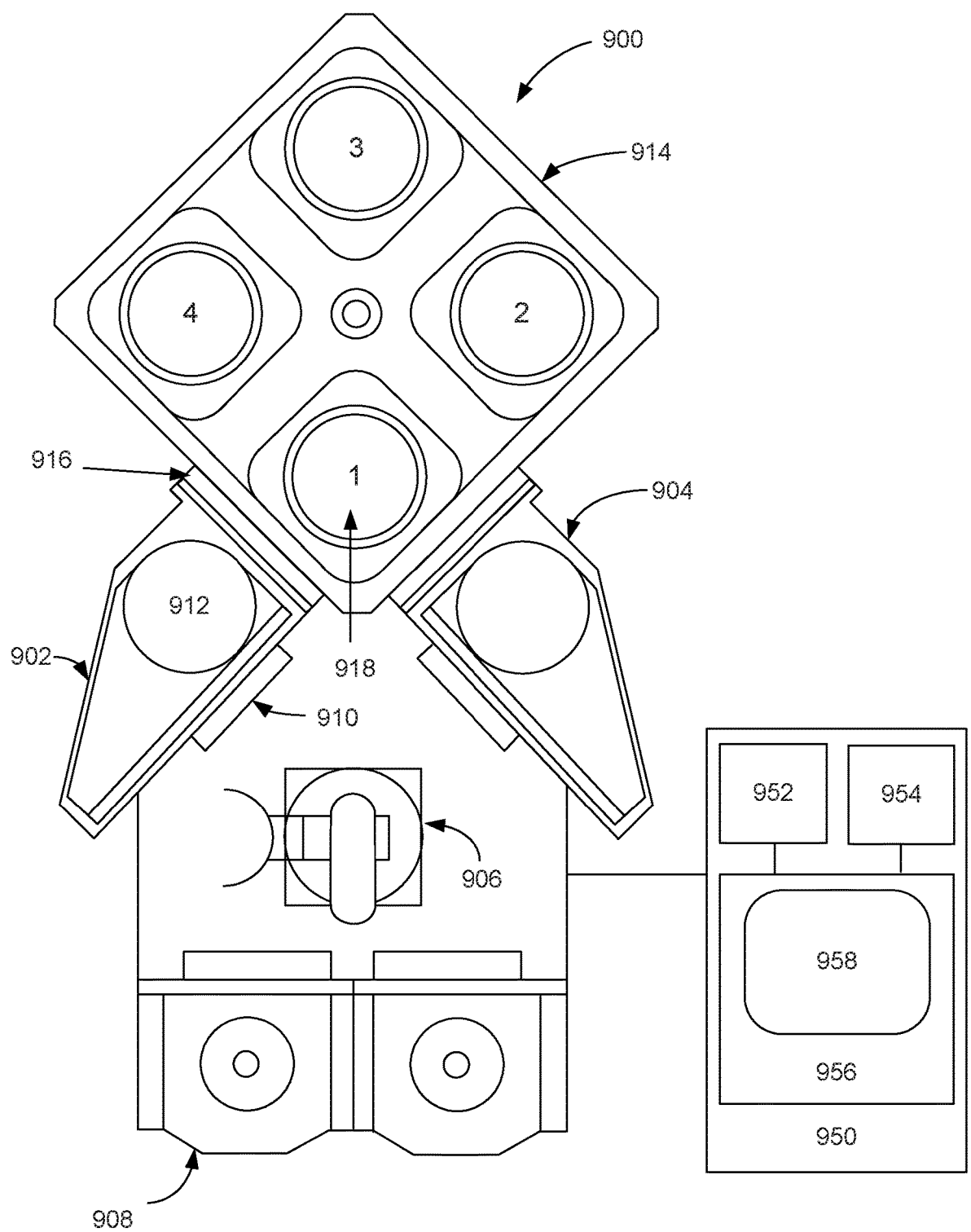
FIG. 9 is a schematic diagram of an example process tool for performing disclosed implementations.

FIG. 8 is a schematic diagram of an example process chamber for performing disclosed implementations. FIG. 8 depicts an atomic layer deposition (ALD) process station 800 having a process chamber body 802 for maintaining a low-pressure environment. A plurality of ALD process stations 800 may be included in a common low pressure process tool environment. For example, FIG. 9 depicts an implementation of a multi-station processing tool 900. In some implementations, one or more hardware parameters of ALD process station 800 including those discussed in detail below may be adjusted programmatically by one or more system controllers 850. The ALD process station 800 may be capable of performing the ALD-integrated surface treatment described above for treating a dielectric film (e.g., $SiO_x$.

ALD process station 800 fluidly communicates with reactant delivery system 801a for delivering process gases to a distribution showerhead 806. Reactant delivery system 801a includes a mixing vessel 804 for blending and/or conditioning process gases, such as an aminosilane precursor gas or other precursor gas, oxygen-containing reactant gas (e.g., ozone), and/or nitrogen-containing reactant gas, for delivery to showerhead 806. One or more mixing vessel inlet valves 820 may control introduction of process gases to mixing vessel 804. Plasma may also be delivered to the showerhead 806 or may be generated in the ALD process station 800.

As an example, the implementation of FIG. 8 includes a vaporization point 803 for vaporizing liquid reactant to be supplied to the mixing vessel 804. In some implementations, vaporization point 803 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some implementations, delivery piping downstream of vaporization point 803 may be heat traced. In some examples, mixing vessel 804 may also be heat traced. In one non-limiting example, piping downstream of vaporization point 803 has an increasing temperature profile extending from approximately 100° C. to approximately 150° C. at mixing vessel 804.

In some implementations, liquid precursor or liquid reactant may be vaporized at a liquid injector. For example, a liquid injector may inject pulses of a liquid reactant into a carrier gas stream upstream of the mixing vessel. In one implementation, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 803. In one scenario, a liquid injector may be mounted directly to mixing vessel 804. In another scenario, a liquid injector may be mounted directly to showerhead 806.

In some implementations, a liquid flow controller (LFC) upstream of vaporization point 803 may be provided for controlling a mass flow of liquid for vaporization and delivery to process station 800. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some implementations, the LFC may be dynamically switched between a feedback control mode and a direct control mode. In some implementations, this may be performed by disabling a sense tube of the LFC and the PID controller.

Showerhead 806 distributes process gases toward wafer 812. In the implementation shown in FIG. 8, the wafer 812 is located beneath showerhead 806 and is shown resting on a pedestal 808. Showerhead 806 may have any suitable shape, and may have any suitable number and arrangement of ports for distributing process gases to wafer 812.

In some implementations, pedestal 808 may be raised or lowered to expose wafer 812 to a volume between the wafer 812 and the showerhead 806. It will be appreciated that, in some implementations, pedestal height may be adjusted programmatically by a suitable system controller 850.

In another scenario, adjusting a height of pedestal 808 may allow a plasma density to be varied during plasma activation cycles in the process in implementations where a plasma is ignited. At the conclusion of the process phase, pedestal 808 may be lowered during another wafer transfer phase to allow removal of wafer 812 from pedestal 808.

In some implementations, pedestal 808 may be temperature controlled via heater 810. In some implementations, the pedestal 808 may be heated to a temperature of at least about 250° C., or in some implementations, less than about 300° C., such as about 250° C., during deposition of silicon oxide films as described in disclosed implementations. In some implementations, the pedestal 808 is set at a temperature between about 50° C. and about 300° C., such as at a temperature between about 200° C. and about 275° C. In some implementations, the pedestal 808 is set at a temperature between about 50° C. and about 300° C. In some implementations, the pedestal 808 is set at a temperature between about 200° C. and about 275° C.

Further, in some implementations, pressure control for process station 800 may be provided by butterfly valve 818. As shown in the implementation of FIG. 8, butterfly valve 818 throttles a vacuum provided by a downstream vacuum pump (not shown). However, in some implementations, pressure control of process station 800 may also be adjusted by varying a flow rate of one or more gases introduced to the process station 800.

In some implementations, a position of showerhead 806 may be adjusted relative to pedestal 808 to vary a volume between the wafer 812 and the showerhead 806. Further, it will be appreciated that a vertical position of pedestal 808 and/or showerhead 806 may be varied by any suitable mechanism within the scope of the present disclosure. In some implementations, pedestal 808 may include a rotational axis for rotating an orientation of wafer 812. It will be appreciated that, in some implementations, one or more of these example adjustments may be performed programmatically by one or more suitable system controllers 850.

In some implementations where plasma may be used as discussed above, showerhead 806 and pedestal 808 electrically communicate with a radio frequency (RF) power supply 814 and matching network 816 for powering a plasma. In some implementations, the plasma energy may be controlled by controlling one or more of a process station pressure, a gas concentration, an RF source power, an RF source frequency, and a plasma power pulse timing. For example, RF power supply 814 and matching network 816 may be operated at any suitable power to form a plasma having a desired composition of radical species. Examples of suitable powers are about 150 W to about 6000 W. Plasma may be used during treatment of a silicon oxide surface prior to deposition of photoresist on the silicon oxide surface. RF power supply 814 may provide RF power of any suitable frequency. In some implementations, RF power supply 814 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some implementations, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some implementations, one or more plasma parameters may be programmatically adjusted based on measurements from such in-situ plasma monitors. For example, an OES sensor may be used in a feedback loop for providing programmatic control of plasma power. It will be appreciated that, in some implementations, other monitors may be used to monitor the plasma and other process characteristics. Such monitors may include, but are not limited to, infrared (IR) monitors, acoustic monitors, and pressure transducers.

In some implementations, instructions for a system controller 850 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some implementations, instructions for setting one or more reactor parameters may be included in a recipe phase. For example, a first recipe phase may include instructions for setting a flow rate of a precursor gas, instructions for setting a flow rate of a carrier gas (such as argon), instructions for setting a flow rate of a reactant gas, instructions for igniting a plasma, and time delay instructions for the first recipe phase. A second, subsequent recipe phase may include instructions for modulating or stopping a flow rate of an inert and/or a reactant gas, and instructions for modulating a flow rate of a carrier or purge gas, and time delay instructions for the second recipe phase. A third, subsequent recipe phase may include instructions for setting a flow rate of an organosilicon precursor gas, instructions for setting a flow rate of a carrier gas (such as argon), instructions for igniting an inert gas plasma, and time delay instructions for a third recipe phase. A fourth, subsequent recipe phase may include instructions for modulating or stopping a flow rate of the organosilicon precursor gas, instructions for modulating the flow rate of a carrier or purge gas, and time delay instructions for the fourth recipe phase. It will be appreciated that these recipe phases may be further subdivided and/or iterated in any suitable way within the scope of the disclosed implementations. In some implementations, the system controller 850 may include any of the features described below with respect to system controller 950 of FIG. 9.

As described above, one or more process stations may be included in a multi-station processing tool. FIG. 9 is a schematic diagram of an example process tool for performing disclosed implementations. FIG. 9 shows an implementation of a multi-station processing tool 900 with an inbound load lock 902 and an outbound load lock 904, either or both of which may include a remote plasma source. A robot 906 at atmospheric pressure is configured to move wafers from a cassette loaded through a pod 908 into inbound load lock 902 via an atmospheric port 910. A wafer is placed by the robot 906 on a pedestal 912 in the inbound load lock 902, the atmospheric port 910 is closed, and the load lock is pumped down. Where the inbound load lock 902 includes a remote plasma source, the wafer may be exposed to a remote plasma treatment to treat the silicon oxide surface in the load lock prior to being introduced into a processing chamber 914. Further, the wafer also may be heated in the inbound load lock 902 as well, for example, to remove moisture and adsorbed gases. Next, a chamber transport port 916 to processing chamber 914 is opened, and another robot (not shown) places the wafer into the reactor on a pedestal of a first station shown in the reactor for processing. While the implementation depicted in FIG. 9 includes load locks, it will be appreciated that, in some implementations, direct entry of a wafer into a process station may be provided.

The depicted processing chamber 914 includes four process stations, numbered from 1 to 4 in the implementation shown in FIG. 9. Each station has a heated pedestal (shown at 918 for station 1), and gas line inlets. It will be appreciated that in some implementations, each process station may have different or multiple purposes. For example, in some implementations, a process station may be switchable between an ALD and plasma-enhanced ALD process mode. Additionally or alternatively, in some implementations, processing chamber 914 may include one or more matched pairs of ALD and plasma-enhanced ALD process stations. While the depicted processing chamber 914 includes four stations, it will be understood that a processing chamber according to the present disclosure may have any suitable number of stations. For example, in some implementations, a processing chamber may have five or more stations, while in other implementations a processing chamber may have three or fewer stations.

FIG. 9 depicts an implementation of a wafer handling system 990 for transferring wafers within processing chamber 914. In some implementations, wafer handling system 990 may transfer wafers between various process stations and/or between a process station and a load lock. It will be appreciated that any suitable wafer handling system may be employed. Non-limiting examples include wafer carousels and wafer handling robots. FIG. 9 also depicts an implementation of a system controller 950 employed to control process conditions and hardware states of process tool 900. System controller 950 may include one or more memory devices 956, one or more mass storage devices 954, and one or more processors 952. Processor 952 may include a CPU or computer, analog, and/or digital input/output connections, stepper motor controller boards, etc.

In some implementations, system controller 950 controls all of the activities of process tool 900. System controller 950 executes system control software 958 stored in mass storage device 954, loaded into memory device 956, and executed on processor 952. Alternatively, the control logic may be hard coded in the system controller 950. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 958 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 900. System control software 958 may be configured in any suitable way. For example, various process tool component subroutines or control objects may be written to control operation of the process tool components used to carry out various process tool processes. System control software 958 may be coded in any suitable computer readable programming language.

In some implementations, system control software 958 may include input/output control (IOC) sequencing instructions for controlling the various parameters described above. Other computer software and/or programs stored on mass storage device 954 and/or memory device 956 associated with system controller 950 may be employed in some implementations. Examples of programs or sections of programs for this purpose include a wafer positioning program, a process gas control program, a pressure control program, a heater control program, and a plasma control program.

A wafer positioning program may include program code for process tool components that are used to load the wafer onto pedestal 918 and to control the spacing between the wafer and other parts of process tool 900.

A process gas control program may include code for controlling gas composition (e.g., silicon-containing precursor gases, organosilicon precursors, oxygen-containing reactant gases, nitrogen-containing reactant gases, carrier gases and/or purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the wafer. Alternatively, the heater control program may control delivery of a heat transfer gas (such as helium) to the wafer.

A plasma control program may include code for setting RF power levels applied to the process electrodes in one or more process stations in accordance with the implementations herein.

A pressure control program may include code for maintaining the pressure in the reaction chamber in accordance with the implementations herein.

In some implementations, there may be a user interface associated with system controller 950. The user interface may include a display screen, graphical software displays of the apparatus and/or process conditions, and user input devices such as pointing devices, keyboards, touch screens, microphones, etc.

In some implementations, parameters adjusted by system controller 950 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 950 from various process tool sensors. The signals for controlling the process may be output on the analog and digital output connections of process tool 900. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 950 may provide program instructions for implementing the above-described deposition processes. The program instructions may control a variety of process parameters, such as DC power level, RF bias power level, pressure, temperature, etc. The instructions may control the parameters to operate in-situ deposition and surface treatment of film stacks according to various implementations described herein.

The system controller 950 will typically include one or more memory devices and one or more processors configured to execute the instructions so that the apparatus will perform a method in accordance with disclosed implementations. Machine-readable media containing instructions for controlling process operations in accordance with disclosed implementations may be coupled to the system controller 950.

In some implementations, the system controller 950 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 950, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 950 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 950 in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The system controller 950, in some implementations, may be a part of or coupled to a computer that is integrated with, coupled to the system, otherwise networked to the system, or a combination thereof. For example, the system controller 950 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 950 receives instructions in the form of data, which specify parameters for each of the processing steps to be performed during one or more operations. It should be understood that the parameters may be specific to the type of process to be performed and the type of tool that the system controller 950 is configured to interface with or control. Thus as described above, the system controller 950 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 950 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The system controller 950 may control the activities of the process tool 900. In some implementations, the system controller 950 includes instructions for performing the following operations: (a) depositing, in a processing chamber, a silicon-containing layer on the wafer by ALD, and (b) introducing, in the processing chamber, a dose of an organosilicon precursor in a vapor phase onto a wafer surface to increase a hydrophobicity of the wafer surface. The operations in (a) and (b) may be performed without introducing a vacuum break in between operations. Depositing the silicon-containing layer includes at least one or more ALD cycles, where each ALD cycle includes introducing a dose of a silicon-containing precursor onto the wafer surface and converting the silicon-containing precursor to form an adsorption-limited amount of the silicon-containing layer. Converting the silicon-containing precursor can occur by thermal conversion or plasma conversion with a reactant species. In some implementations, the silicon-containing layer includes a silicon nitride, a silicon carbide, a silicon carbide, or combinations thereof, and introducing the dose of the organosilicon precursor includes adsorbing the organosilicon precursor on the wafer surface without converting the organosilicon precursor in an ALD cycle. In some implementations, the controller further includes instructions for performing: (c) exposing the wafer to an inert gas RF plasma. In some implementations, the controller further includes instructions for performing: transferring the wafer out of the processing chamber to a deposition chamber configured to deposit a photoresist on the silicon-containing layer. Adhesion between the photoresist and the silicon-containing layer may be strong after introducing the dose of the organosilicon precursor.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., wafer, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Conclusion

In the foregoing description, numerous specific details are set forth to provide a thorough understanding of the presented implementations. The disclosed implementations may be practiced without some or all of these specific details. In other instances, well-known process operations have not been described in detail to not unnecessarily obscure the disclosed implementations. While the disclosed implementations are described in conjunction with the specific implementations, it will be understood that it is not intended to limit the disclosed implementations.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for increasing hydrophobicity of a wafer surface, the method comprising:
depositing a silicon-containing layer on a wafer by atomic layer deposition (ALD); and
introducing a dose of an organosilicon precursor in a vapor phase onto a wafer surface to increase a hydrophobicity of the wafer surface; and
exposing, after introducing the dose of the organosilicon precursor, the wafer to an RF plasma, wherein the RF plasma is an inert gas plasma, wherein conditions associated with the inert gas plasma modulates the hydrophobicity of the wafer surface.

2. The method of claim 1,
wherein an RF power applied to the RF plasma is between 100 W and 500 W.

3. The method of claim 2, wherein a chamber pressure when exposing the wafer to the RF plasma is between about 0.5 Torr and about 5 Torr, and wherein an exposure time when exposing the wafer to the RF plasma is between about 0.25 seconds and about 50 seconds.

4. The method of claim 1, wherein depositing the silicon-containing layer by ALD comprises:
introducing a dose of a silicon-containing precursor onto the wafer surface; and converting the silicon-containing precursor to form an adsorption-limited amount of the silicon-containing layer.

5. The method of claim 1, further comprising:
transferring the wafer outside of an ALD chamber to a deposition chamber configured to deposit a photoresist on the silicon-containing layer.

6. The method of claim 1, wherein introducing the dose of the organosilicon precursor comprises adsorbing the organosilicon precursor on the wafer surface without converting the organosilicon precursor in an atomic layer deposition cycle.

7. The method of claim 1, further comprising:
depositing, before introducing the dose of the organosilicon precursor, a hydrophobic layer on the silicon-containing layer, wherein the hydrophobic layer includes hexamethyldisilazane (HMDS) or polydimethylsiloxane (PDMS).

8. The method of claim 1, wherein depositing the silicon-containing layer by ALD and introducing the dose of the organosilicon precursor occurs in an ALD chamber without introducing a vacuum break.

9. The method of claim 8, further comprising:
transferring the wafer outside the ALD chamber to a deposition chamber configured to deposit a photoresist on the silicon-containing layer.

10. The method of claim 1, further comprising:
depositing, after introducing the dose of the organosilicon precursor, a photoresist on the surface of the silicon-containing layer.

11. The method of claim 1, wherein a contact angle measurement on the wafer surface after introducing the dose of the organosilicon precursor is equal to or greater than about 40°.

12. The method of claim 1, wherein the organosilicon precursor includes an aminosilane.

13. The method of claim 1, wherein the silicon-containing layer includes a silicon nitride, a silicon carbide, a silicon oxide, or combinations thereof.

14. The method of claim 1, wherein the wafer surface includes a hydrophobic layer on the silicon-containing layer.

* * * * *